US 6,649,498 B2

(12) United States Patent
Münch

(10) Patent No.: US 6,649,498 B2
(45) Date of Patent: Nov. 18, 2003

(54) METAL FILM PROTECTION OF THE SURFACE OF A STRUCTURE FORMED ON A SEMICONDUCTOR SUBSTRATE DURING ETCHING OF THE SUBSTRATE BY A KOH ETCHANT

(75) Inventor: Ulrich Münch, Neuchâtel (CH)

(73) Assignee: EM Microelectronic, Marin (SA)

( * ) Notice: Subject to any disclaimer, the term of this patent is extended or adjusted under 35 U.S.C. 154(b) by 70 days.

(21) Appl. No.: 10/071,576

(22) Filed: Feb. 8, 2002

(65) Prior Publication Data

US 2002/0142508 A1 Oct. 3, 2002

Related U.S. Application Data

(62) Division of application No. 09/688,850, filed on Oct. 16, 2000, now Pat. No. 6,538,328.

(30) Foreign Application Priority Data

Nov. 10, 1999 (CH) .............................................. 2057/99

(51) Int. Cl.[7] .............................................. H01L 21/20
(52) U.S. Cl. ...................... 438/584; 438/702; 438/745; 438/625; 438/419; 257/763; 257/762
(58) Field of Search ................................ 438/584, 702, 438/745, 580, 625, 419, 53, 481, 495, 505; 257/763, 762, 764, 765, 664

(56) References Cited

U.S. PATENT DOCUMENTS

| 4,585,209 A | 4/1986 | Aine |
| 4,880,708 A | 11/1989 | Sharma |
| 5,182,631 A | 1/1993 | Tomimuro |
| 5,277,756 A | 1/1994 | Dion |
| 5,310,449 A | 5/1994 | Henderson |
| 5,608,264 A | 3/1997 | Gaul |
| 5,618,752 A | 4/1997 | Gaul |
| 5,693,181 A | 12/1997 | Bernstein |
| 5,753,537 A | 5/1998 | Dekker |
| 5,804,462 A | 9/1998 | Liu |
| 5,821,596 A | 10/1998 | Miu |
| 5,929,497 A | * 7/1999 | Chavan et al. ............... 257/417 |
| 6,032,536 A | * 3/2000 | Peeters et al. ................ 73/725 |
| 6,109,113 A | * 8/2000 | Chavan et al. ................ 73/718 |
| 6,290,388 B1 | * 9/2001 | Saul et al. .................... 374/44 |
| 6,379,990 B1 | * 4/2002 | Muller et al. .................. 438/53 |

FOREIGN PATENT DOCUMENTS

EP 0905495 A1 3/1999

* cited by examiner

Primary Examiner—Matthew Smith
Assistant Examiner—V. Yevsikov
(74) Attorney, Agent, or Firm—Richard K Robinson

(57) ABSTRACT

The present invention concerns the field of microstructures and in particular microstructures made via CMOS technology on semiconductor substrates intended to undergo micromachining by wet chemical etching, in particular by a KOH etchant. According to the present invention, protection against the KOH reactive agent is provided to such a structure by the deposition of a metal film (40, 41, 43) including at least on external gold layer (43) on the surface of the structure. This metal film (40, 41, 43) advantageously allows the use of mechanical protective equipment to be omitted and thus allows the wafers to be processed in batches. The present invention also proves perfectly compatible with a standard gold bumping process.

11 Claims, 5 Drawing Sheets

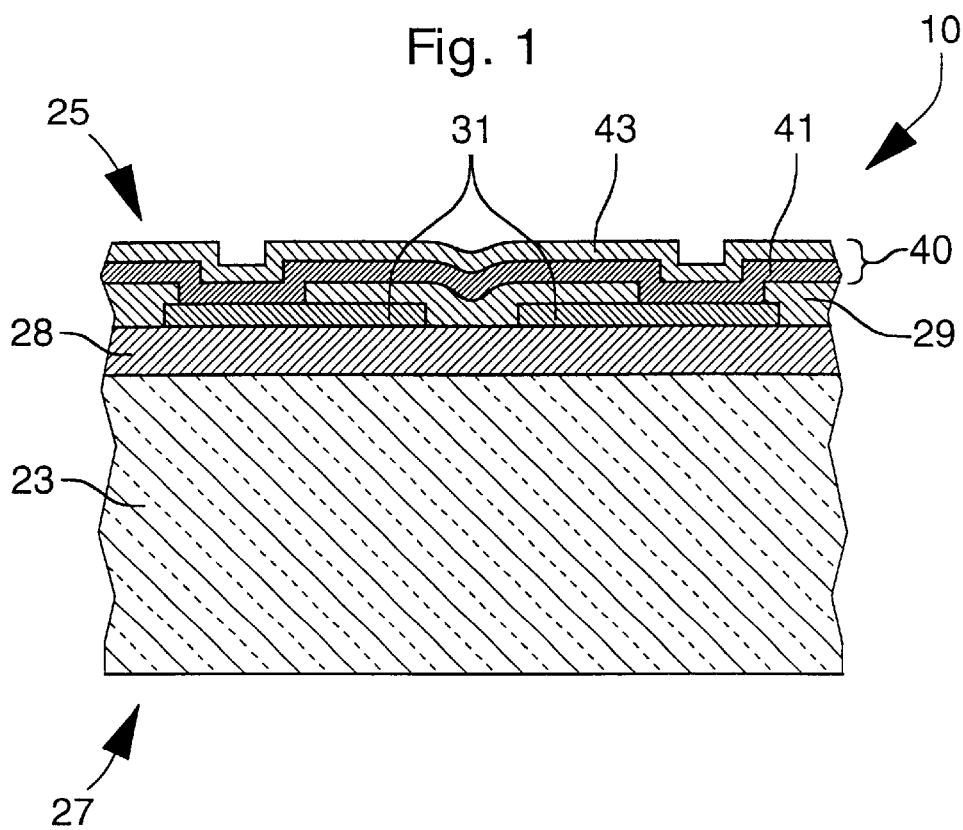
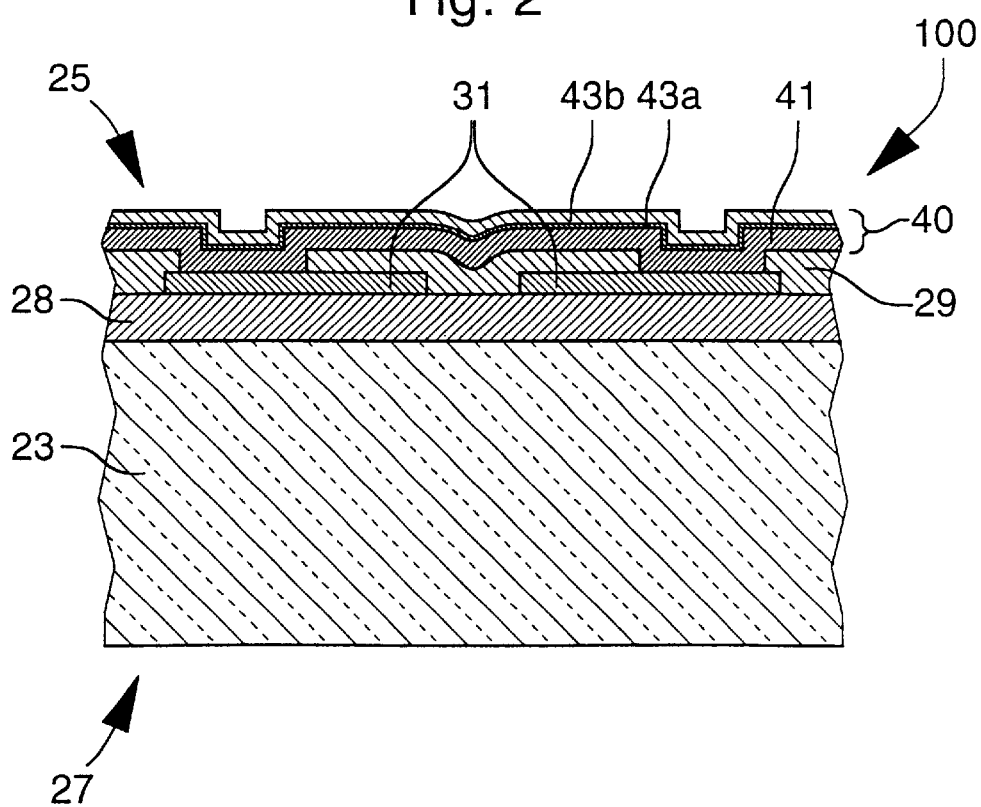

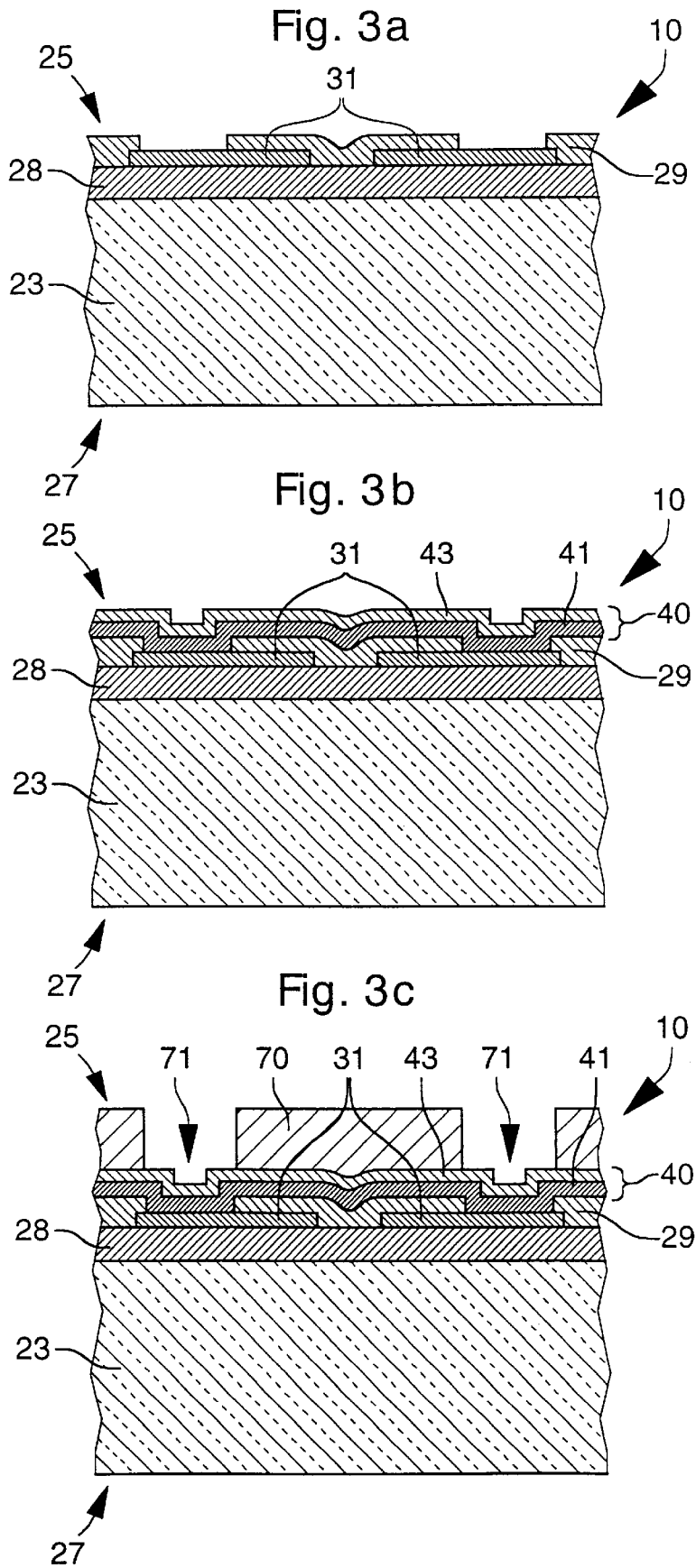

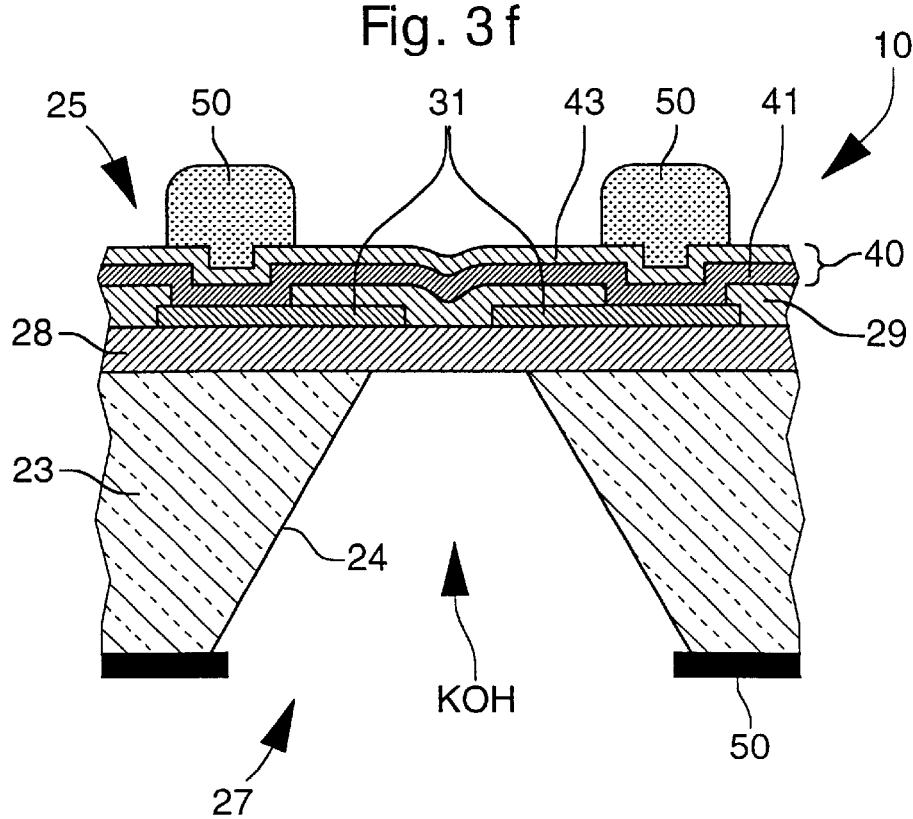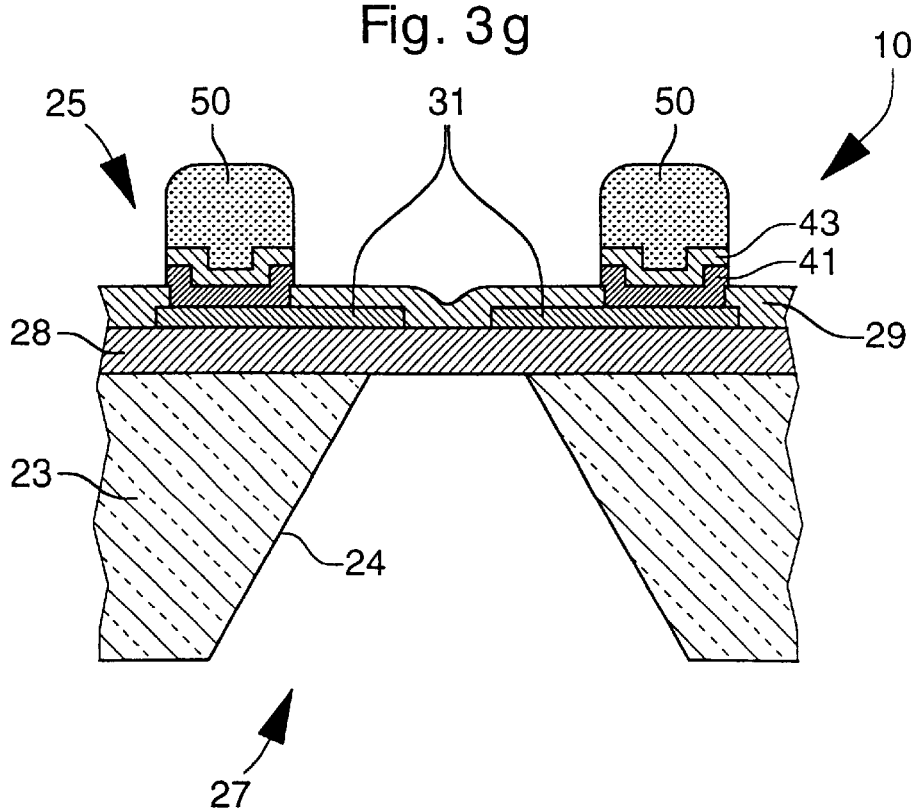

METAL FILM PROTECTION OF THE SURFACE OF A STRUCTURE FORMED ON A SEMICONDUCTOR SUBSTRATE DURING ETCHING OF THE SUBSTRATE BY A KOH ETCHANT

This application is a division of application Ser. No. 09/688,850 filed on Oct. 16, 2000, now U.S. Pat. No. 6,538,328.

The present invention concerns the field of microstructures and in particular microstructures made via CMOS technology on semiconductor substrates intended to undergo micro-machining by wet chemical etching.

In the field of certain specific applications, micro-machining is commonly achieved by wet chemical etching of a semiconductor substrate, such as a silicon substrate, on which CMOS elements, such as integrated circuits, have previously been formed. Integrated sensors, in particular, are produced in this manner, such as pressure sensors, including for example a membrane which is formed by making a cavity in the semiconductor substrate. The integrated circuits of the sensor are formed on a first face or front face of the semiconductor substrate, and the second face or back face on which a masking layer resistant to the etchant used has previously been deposited, is subjected to chemical etching by a suitable etchant. A silicon semiconductor substrate can thus be etched by a KOH etchant, the masking layer being for example a film formed of silicon nitride.

In such applications, the face of the semiconductor substrate on which the integrated circuits are formed includes zones capable of being etched by the reactive agent of the etchant. In particular, the substrate may include connection pads formed of aluminium which can be etched by the KOH reactive agent. As a result it is necessary to protect such zones. Mechanical protective equipment is thus typically used such as stainless steel or Teflon™ equipment, arranged on the front face of the substrate including the zones capable of being etched by the KOH reactive agent.

A typical drawback of micro-machining by KOH chemical etching thus lies in the use of such mechanical equipment to protect the zones concerned, and in the fact that such use involves wafer by wafer processing, which is contrary to the usual concerns as to cost and yield in the semiconductor industry.

It will be noted that other etchants are available to those skilled in the art, such as TMAH (Tetra-Methyl-Ammonium Hydroxide) or EDP (Ethylene Diamine Pyrocatechol) to replace the KOH. These etchants do not have the drawback of etching the aluminium connection pads and thus do not require the use of mechanical protective equipment. However, these agents have non-negligible drawbacks.

Indeed, with respect to the KOH etchant, the EDP and TMAH etchants are more expensive and less stable. The stability of KOH is of the order of several months, and those of TMAH and EDP etchants is of the order of several hours and several minutes respectively. It will also be noted that it is suspected that the EDP etchant has carcinogenic properties.

Recently, techniques have been developed to protect the front face of the substrate against etching by the KOH etchant by means of thin protective films deposited on this surface. An article entitled "Fluorocarbon film for protection from alkaline etchant" by Y. Matsumoto, derived from a conference in Chicago entitled TRANSDUCERS 97, describes for example the use of an additional protective layer formed of fluorocarbon.

One drawback of using a component such as fluorocarbon lies in the fact that it require the use of additional equipment to implement it in an industrial environment in which it is not commonly used.

Another drawback of using such a component lies in the fact that it is not compatible with the conventional photo-lithographical steps, since this component requires the use of a specific resist. Moreover, it has been observed that this resist is capable of becoming easily detached, so that it cannot be used as a photolithographical mask.

Another disadvantage of known protective techniques against etching by the KOH etchant relying on protective films deposited on the surface of the substrate, lies in the fact that they are typically incompatible with the standard process for forming electric connection bumps, in particular electric connection bumps made of gold, this standard process being commonly called "gold bumping".

One object of the present invention is thus to propose a protection of the surface of a structure formed on a semiconductor substrate, this protection giving the surface of the structure resistance to etching by the KOH etchant and overcoming the aforementioned drawbacks.

Another object of the present invention is to propose a protection of this type which is also compatible with the standard methods of forming electric connection bumps, and in particular gold bumping.

Another object of the present invention is to propose a protection of this type which also answers the conventional criteria in the semiconductor industry linked to cost, yield and to the environment, as regards the materials used to form this layer.

The present invention therefore concerns a structure formed on a semiconductor substrate intended to be etched by a KOH etchant whose characteristics are listed in claim 1.

The present invention also concerns a method of manufacturing such a structure the characteristics of which are listed in claim 7.

The present invention also concerns a method of manufacturing an integrated sensor with a dielectric membrane the characteristics of which are listed in claim 8.

Advantageous embodiments of the present invention form the subject of dependent claims.

One advantage of the present invention lies in the fact that the protective film covers the different zones capable of being etched by the KOH etchant, in particular the aluminium connection pads, which gives the structure protection against this etchant. This results in a high manufacturing yield.

Another advantage of the present invention lies in the fact that the protective film gives resistance to the reactive etchant, so that the structure can undergo processing by batches of wafers, i.e. without using additional mechanical equipment to protect this structure wafer by wafer.

A further advantage of the present invention lies in the fact that the protective film is perfectly compatible with gold bumping.

These objects, characteristics and advantages of the present invention, in addition to others, will appear more clearly upon reading the following detailed description, made with reference to the annexed drawings given by way of non-limiting example, in which:

FIG. 1 illustrates a first variant of a structure including a protective metal film according to the invention;

FIG. 2 illustrates a second variant of a structure including a protective metal film according to the invention;

FIGS. 3a to 3g show manufacturing steps of an integrated sensor with a dielectric membrane relying on the protective metal film according to the present invention.

Figure 3D:
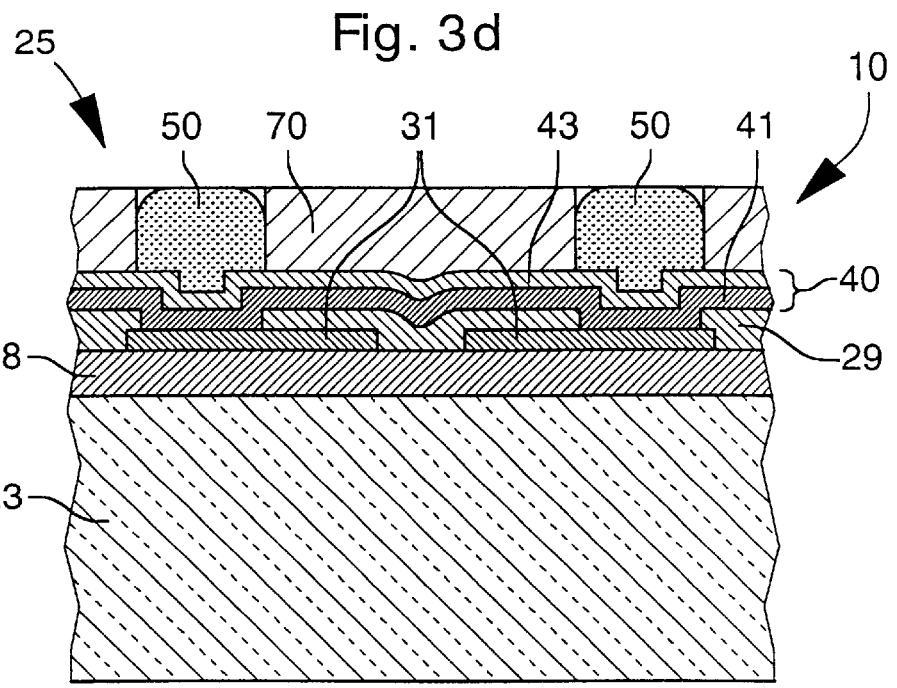

FIG. 1 shows a structure, indicated generally by the numerical reference 10, formed on a semiconductor substrate 23 having a first face 25 or front face, and a second face 27 or back face. This substrate 23 is formed of a semiconductor base intended to be etched by the KOH reactive agent. This base material is preferably silicon.

It will be noted in the following description that the notion of front face and back face can be defined for each of the layers which will be formed on substrate 23, so that all the front faces are located on the same side as face 25, and that all the back faces are located on the same side as face 27.

In the typical case of forming an integrated sensor with a dielectric membrane, a dielectric layer 28 of silicon oxide is formed on front face 25. Structure 10 further includes a passivation layer 29, such as a layer of silicon nitride, formed so as not to cover at least a zone 31 formed of a material capable of being etched by the reactive agent. Zones 31 of FIG. 1 may, in particular, be aluminium connection pads.

According to the present invention, a metal film, designated by the numerical reference 40 in FIG. 1, including at least one external gold layer 43 is deposited on the front face of substrate 23. The external gold layer 43 is formed, in this example, by sputtering gold on the front face of structure 10.

Metal film 40 is thus formed of at least one external gold layer 43 which has the advantage of being particularly resistant to etching by the KOH reactive agent. This layer of gold is thus suited to protecting connection pads 31 efficiently during etching by the KOH reactive agent.

Preferably, an intermediate metal layer 41 is deposited on the front face of the structure, prior to deposition of outer gold layer 43. This intermediate metal layer 41 acts as a barrier against the diffusion of gold in the lower layers formed on the front face of structure 10, in particular the silicon oxide layer 28. Therefore, the intermediate metal layer will also be called the "diffusion barrier".

It is also to be noted that gold does not adhere well to silicon. Intermediate metal layer 41 thus also acts as an adhesion promoter. As will be seen hereinafter, this intermediate metal layer 41 is preferably formed of a metal material or a combination of metal materials selected from among Ti, TiW, TiN or TiW:N.

As will be seen in detail hereinafter, the present invention proves particularly advantageous in the event that the structure is intended to undergo an operation for forming electric connection "bumps". In particular, the present invention proves particularly advantageous in the event that the structure has to undergo gold bumping. In such a case, the external gold layer will also be called the "plating base" or "electro-deposition base".

FIG. 2 shows an alternative embodiment of the structure of FIG. 1. It will be noted that structure 100 illustrated in FIG. 2 is substantially similar to structure 10 of FIG. 1. Thus, for the sake of simplicity, the layers shown in FIG. 2 common to this second structure and to the structure of FIG. 1 are designated by the same numerical references.

Thus structure 100 illustrated in FIG. 2 includes a semiconductor substrate 23, a dielectric layer 28 formed on the front face of substrate 23, connection pads 31 and a passivation layer 29 which does not cover all of connection pads 31.

Unlike structure 10 of FIG. 1, structure 100 includes a metal film 40 including at least one external gold layer 43 formed of a first thin gold layer 43a and a second thicker gold layer 43b. Metal film 40 preferably includes an intermediate metal layer 41 which is similar to the intermediate metal layer of FIG. 1 and which fulfils the same functions.

First thin gold layer 43a is a fine sputtered gold layer acting as electric contact for the electro-deposition of second thicker gold layer 43b. It will be seen in the following description that this variant of metal protective film 40 includes advantages which will be presented hereinafter in detail.

FIGS. 3a to 3g show intermediate steps of a method of manufacturing an integrated sensor with a dielectric membrane wherein, according to the present invention, the metal protective film according to the present invention is advantageously used to assure protection of the connection pads of the sensor during the etching operation by the KOH reactive agent. Identical references to the references used in FIG. 1 are used to indicate common elements.

It will be noted that in FIGS. 3a to 3g, metal film 40 includes an intermediate metal layer 41 and an external gold layer 43 formed according to either of the variants described with reference to FIGS. 1 and 2.

FIG. 3a thus illustrates an intermediate stage of the method of manufacturing an integrated sensor with a membrane. At this stage, the intermediate structure of the sensor, globally indicated by the numerical reference 10, has dielectric layer 28, such as a silicon oxide layer, formed on face 25 of substrate 23. Connection pads 31 as well as passivation layer 29 exposing a portion of connection pads 31 have also been formed on the front face of structure 10. Passivation layer 29 is typically a silicon nitride or silicon oxynitride layer, and connection pads 31 are typically made of aluminium.

At this stage of manufacturing the integrated sensor, bumping may begin. This bumping process thus begins, as is illustrated in FIG. 3b, by the deposition of a metal film, indicated by the numerical reference 40, including at least one external layer 43 formed of gold. Metal film 40 also includes an intermediate metal layer, designated 43, deposited prior to the formation of external gold layer 43.

It will be noted that metal film 40 including external gold layer 43 and intermediate metal layer 41, covers the entire surface of the front face of structure 10.

Intermediate metal layer 41, amongst other examples a layer of TiW or TiN, is first of all deposited by a sputtering process over the entire surface of the front face of structure 10, then external gold layer 43 is deposited over intermediate metal layer 41.

As was already mentioned, intermediate metal layer 41 essentially fulfils the function of a diffusion barrier preventing the diffusion of gold in the lower layers of structure 10. This intermediate metal layer 41 also fulfils the function of an adhesion promoter improving the adhesion of upper gold layer 43 onto the front face of structure 10. It will be noted that gold adheres poorly to silicon.

According to one or other of the variants described with reference to FIGS. 1 and 2, external gold layer 43 is deposited either in a sputtering step (FIG. 1 variant), or in a first sputtering step of a thin layer of gold followed by a second electro-deposition step of another layer of gold (FIG. 2 variant).

At the end of the deposition of metal layers 41 and 43 forming metal film 40, a conventional photolithographic step is performed. As is illustrated in FIG. 3c, this photolithographic step includes deposition of a thick photoresist layer 70, followed by exposition and processing of this resist layer 70 in order to expose zones 71 of determined dimensions above connection pads 31 which are not covered by passivation layer 29.

The photolithographic step of FIG. 3c is followed by the formation of gold bumps 50. As is illustrated in FIG. 3d, these bumps 50 are formed by electro-deposition, i.e. by an electroplating using gold metal layer 43 as the electric contact and structured resist 70 as the mould.

Figure 3E:
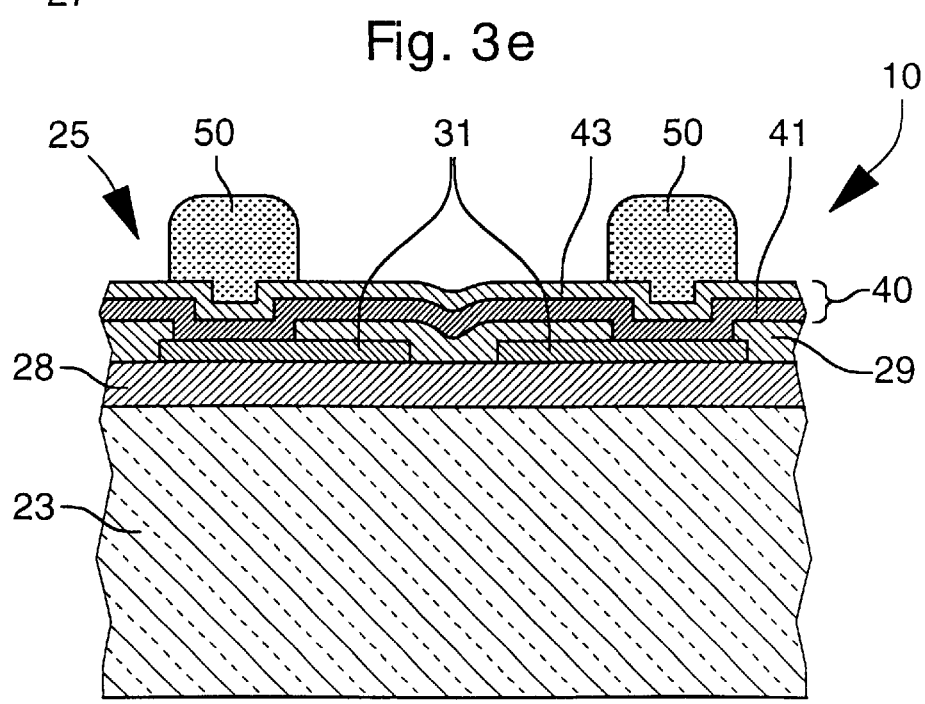

In FIG. 3e, structured resist 70 is then removed. At this stage, it will be noted that electric bumps 50, and a fortiori all of connection pads 31 present on the front face of structure 10, are short-circuited by metal layers 41 and 43.

Prior to the etching operation illustrated in FIG. 3f, a masking layer 75, for example of silicon nitride, is formed on back face 27 of substrate 23, and this masking layer 75 is treated so as to expose a zone of back face 27 of substrate 23.

According to the present invention, the etching operation of substrate 23 by the KOH reactive agent is performed, according to the illustration of FIG. 3f, by using metal film 40 deposited on the front face of structure 10 as protection, in particular connection pads 31, against etching by the KOH reactive agent. Gold layer 43 is perfectly resistant to etching by the KOH reactive agent and thus constitutes an ideal protective layer for protecting the zones of the front face of structure 10 which are capable of being etched by the KOH reactive agent.

According to the present invention, no mechanical protective equipment is therefore necessary to protect the front face of structure 10 against etching by the KOH reactive agent. This advantageously allows processing of the CMOS wafers in batches and thus allows the manufacturing costs to be substantially reduced.

At the end of the etching operation, typically after several hours in a KOH etchant, a cavity 24 is thus formed in substrate 23 which reaches dielectric layer 28, as is shown in FIG. 3f. A membrane formed of the exposed zone of dielectric layer 28 is thus formed.

During a final step, illustrated in FIG. 3g, masking layer 75 formed on the back face of substrate 23 is then removed then structure 10 is subjected to a first etchant allowing external gold layer 43 to be removed, then to a second etchant allowing intermediate metal layer 41 to be removed. At the end of these operations, the different electric bumps 50 are thus electrically separated from each other.

As a complement to what has just been described, the Applicant was able to observe the effects of different materials on the quality of the structure of the integrated sensor at the end of the etching operation by the KOH reactive agent.

In the first place, the Applicant was thus able to make the following observations concerning the choice of materials forming intermediate layer of diffusion barrier 41. As was already mentioned hereinbefore, intermediate metal layer 41 must, on the one hand, act as a barrier against the diffusion of gold in the lower layers of the front face of the structure and, on the other hand, act as promoter of the adhesion of the gold layer onto the front face of the structure.

Metallic materials such as Ti, TiW, TiN or TiW:N have thus been selected. A metal layer of TiW:N is typically obtained by sputtering of layer of TiW in a nitrogen charged atmosphere, the free atoms of TiW reacting with the nitrogen in this atmosphere to form TiN.

Table (1) hereinafter shows the etching speed values, measured by the Applicant, for the aforementioned materials. These etching speeds were measured in a KOH etchant at 95° C. by a resistivity measurement. In this table, and in the following tables, the indices "A" and "B" in brackets indicate that the corresponding layers were formed in accordance with two distinct sputtering systems "A" and "B".

TABLE 1

| Material | KOH etching speed at 95° C. [nm/h] |
|---|---|
| Ti | 804 |
| TiW $_{(A)}$ | 40 |
| TiW:N $_{(A)}$ | 27 |
| TiW $_{(B)}$ | 17 |
| TiN | 12 |

From the point of view of the etching speed, concerning Ti, a too high etching speed, of the order of 1 μm per hour, could thus be observed, for the material to be used as the sole diffusion barrier. Ti, because of its good adhesion and surface coating properties, was nonetheless subsequently used as an additional adhesion layer.

The other metallic materials examined, capable of being used as a diffusion barrier, namely TiW, TiN and TIW:N, have, however, etching speeds of the order of several tens of a nanometer per hour, and thus seem more suited to making intermediate metal layer 41.

It will be noted that the Applicant was also able to observe, concerning TiW, differences in terms of KOH etching speed, according to the type of sputtering system used. Indeed, the two sputtering systems "A" and "B" used to form the TiW layer led to differences of the order of a factor two between the etching speeds of the TiW layer. It thus appears that in addition to the choice of material, the method of deposition used to form the intermediate metal layer must also be taken into account. It will be noted that sputtering of the intermediate metal layer in fact leads to the formation of a layer having holes through which the etchant can potentially penetrate.

The Applicant was also able to observe differences in terms of adhesion between the aforementioned different materials. Table (2) below thus illustrates the adhesion of the layers of TiW deposited in accordance with systems "A" and "B" and of the TiN layer, respectively, on silicon (Si), silicon oxynitride (SiON), and aluminium (Al). These values have been determined by a traction test under a gradual an increasing load. The forces leading to the layer becoming completely detached from the silicon and aluminium, and breakage on silicon oxynitride are indicated in Table (2).

TABLE 2

| | Adherence [N] | | |
|---|---|---|---|
| Material | Si | SiON | Al |
| TiW $_{(A)}$ | 5.10 | 67.82 | 3.05 |
| TiW $_{(B)}$ | 7.70 | 7.15 | 5.56 |
| TiN | 19.73 | 15.53 | 10.40 |

The Applicant was thus able to observe better behaviour in terms of the adhesion of TiN with respect to TiW.

The Applicant was also able to observe differences as regards the integrity of the surface of metal film 40 at the end of the KOH etching of a structure including an intermediate metal layer 41 of varied composition and thickness and a determined external gold layer 43. Table 3 below thus shows the results of tests, performed by the Applicant, of the surface integrity of metal film 40 at the end of a 2 hours etching step in a KOH etchant at 95° C., the metal film was formed of an intermediate metal film 41 of varied thickness and composition, and an external gold layer 43 formed of a first sputtered gold layer of 0.1 μm thickness on which an electroplated gold coating of 0.7 μm had been formed. The surface integrity of the layers was determined optically.

TABLE 3

| Material | Surface integrity |
| --- | --- |
| TiN 0.1 μm | average |
| Ti 0.03 μm TiN 0.1 μm | poor |
| TiN 0.1 μm Ti 0.1 μm TiN 0.1 μm | average |
| TiW 0.3 μm (A) | good |
| TiW:N 0.3 μm (A) | good |
| Ti 0.02 μm TiW 0.3 μm (A) | poor |
| TiW 0.3 μm (B) | good |
| TiW:N 0.3 μm (B) | poor |

This Table (3) shows in particular that the intermediate metal layers including an additional Ti layer lead to rather average results, no doubt due to the high etching speed of Ti in KOH which leads to the layers becoming detached. Table (3) above also shows the importance of the choice of the sputtering system used to form diffusion barrier 41.

In summary, it appears, from observations made by the Applicant, that the candidates for making intermediate metal layer 41 of the structure are preferably TiW, TiN or TiW:N.

Secondly, the Applicant was also able to make the following observations concerning the type of method used to form external gold layer 43. The Applicant thus compared a first external layer of gold formed by sputtering (structure 10 of FIG. 1) to a second outer gold layer formed of a sputtered gold layer of 0.1 μm thickness on which an electro-plated gold coating had been formed (structure 100 of FIG. 2). For an identical total thickness of the order of 0.5 μm, the Applicant was thus able to observe better protection against etching by the KOH etchant with the second aforementioned external gold layer. No change of resistivity was detected after one hour of etching by a KOH etchant at 95° C. for this second external gold layer. It may be assumed that the electro-deposition of an external gold layer leads to films of greater density offering better resistance to etching by the KOH etchant.

The Applicant was also able to observe that heat treatment at 300° C. drastically reduces the quality of protection provided by the external gold layer. High temperature steps in fact lead to an increase in the size of the grains of gold thus forming channels through which the KOH etchant can be channelled, the etchant then reaching the lower layers of the structure.

The Applicant also analysed the efficiency of the protection provided by a metal film 40 formed of an intermediate TiW metal layer, deposited in accordance with the two types of sputtering system "A" and "B", and a layer of gold formed of a first sputtered gold layer of 0.1 μm and a second gold layer of varied thickness formed by electro-deposition (structure 100 of FIG. 2). The metal film was deposited on wafers of 6 inches having undergone the CMOS manufacturing steps. These wafers were immersed in a KOH etchant at 95° C. for four hours, which is enough to form the dielectric membranes in wafers of 600 μm thickness.

Figure 4:
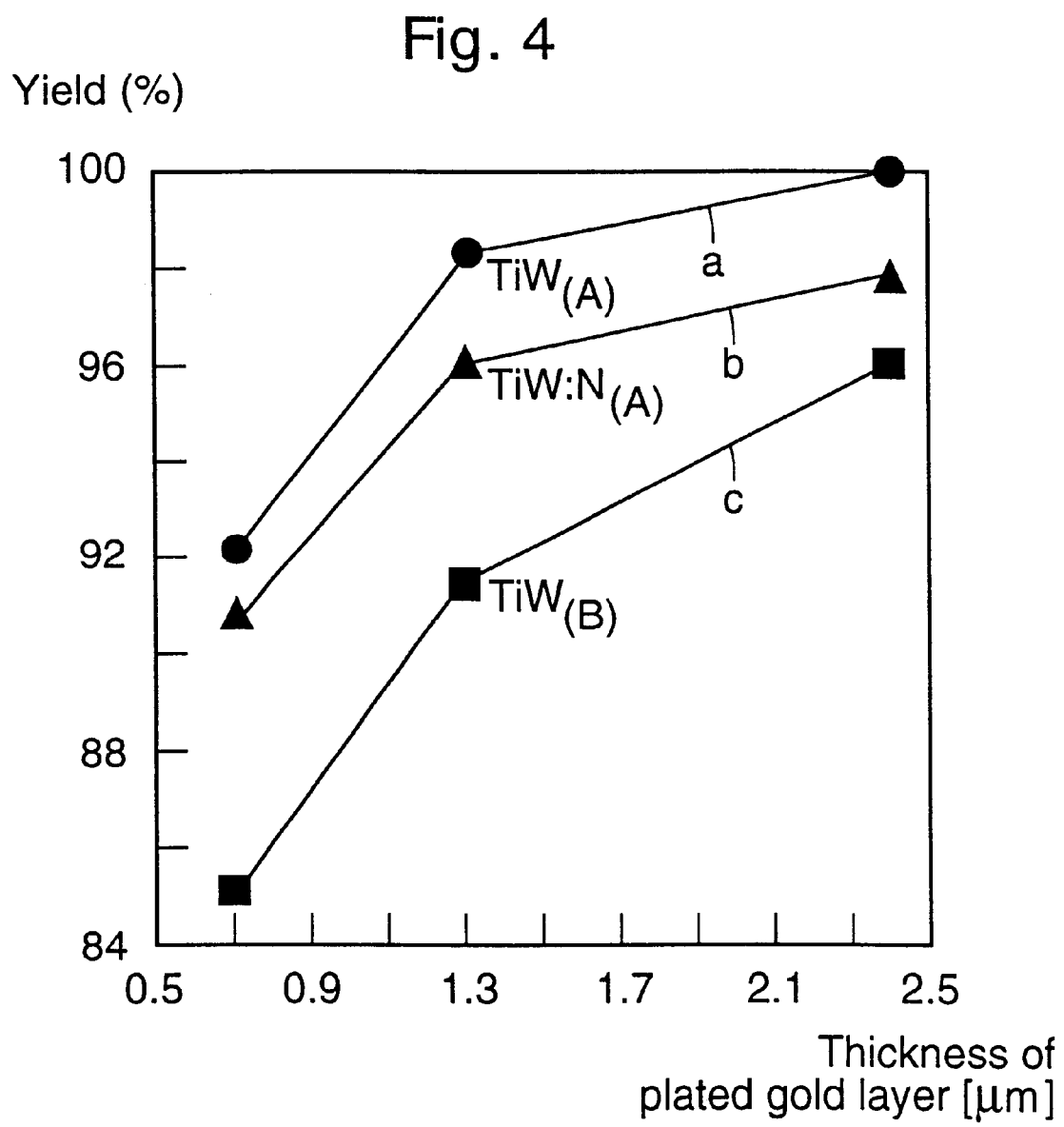
FIG. 4 shows a diagram of the evolution of the yield at the end of an etching operation on a structure using metal films according to the present invention.

FIG. 4 shows a diagram illustrating the evolution of the yield of the structures as a function of the thickness of the external gold layer formed by electro-deposition. It will be noted that yield is defined here as being the percentage of undamaged connection pads at the end of the etching operation by the KOH etchant with respect to the total number of connection pads formed on a given substrate.

FIG. 4 thus illustrates three curves "a", "b" and "c", showing the evolution of the yield of the wafers as a function of the thickness of the electro-deposited gold layer for three types of diffusion barrier of TiW and TiW:N of 0.3 μm thickness. Curve "a" shows the evolution of the yield for a diffusion barrier deposited by sputtering in accordance with system "A", curve "b" the evolution of the yield for a diffusion barrier deposited by sputtering in accordance with system "A" in a nitrogen atmosphere, and curve "c" the evolution of the yield for a diffusion barrier deposited by sputtering in accordance with system "B". A first gold layer of 0.1 μm was first sputtered to form a plating base for the electro-deposition of the second gold layer. The yield was evaluated on a structure of 5.64 by 4.35 mm$^2$.

It is to be noted generally in FIG. 3, that the yield increases with the thickness of the electro-deposited gold layer. However, the yield depends on the sputtering system used to form the diffusion barrier. The best results are obtained with the layer of TiW deposited by means of sputtering system "A".

The difference in yield between sputtering systems "A" and "B" is due to the formation of particles on the surface of the structure which lead to the metal layers becoming detached. It will be noted indeed, that sputtering system "B" which is used is installed in a class 100 clean room, whereas sputtering system "A" is installed in a class 1 clean room. It will also be noted that sputtering system "A" uses a lateral sputtering technique whereas sputtering system "B" uses sputtering technique above the target so that a higher number of large size particules due to the agglomeration of small particles are formed with this system. Because of the lateral sputtering technique used by the "A" system, these agglomerated particles do not, in theory, reach the surface of the target but fall between the sputtering point and the target.

In addition to the improvement observed by the Applicant in the protection afforded by the metal film including the external electroplated gold layer, the electro-deposition of this layer advantageously allows the edges of the wafer to be coated, thus preventing etching of the sides of the wafer by the KOH etchant.

Lastly, the Applicant examined the yield of the dielectric membranes formed at the end of the KOH etching, i.e. the percentage of membranes intact at the end of the etching operation. This membrane yield was evaluated with a protective metal film including an electro-plated gold layer of 1.2 μm on the front face of the structure. The Applicant was able to observe a membrane yield of close to 100% for a total number of 1500 membranes having sizes varying from 350 per 550 μm$^2$ to 875 per 1550 μm$^2$.

The protective metal film was formed of a superposition of a TiW:N diffusion barrier of 0.3 μm thickness, a sputtered gold layer of 0.1 μm thickness and a gold layer of 1.2 μm thickness formed by electro-deposition.

After removing the successive layers of the protective metal film in order to electrically separate the connection pads (illustrated in FIG. 3g), the membrane yield was reduced to 89.3%. The reason for this reduction in the yield is essentially due to the residual compression stress in the dielectric layer which leads to a certain fragility of the membrane, and because the protective metal layers were removed by means of equipment relying on a spray of etchant and rinsing agent, the etchant and rinsing solutions being directly projected onto the membranes thus possibly destroying them.

It will be understood that various modifications and/or adaptations may be made to the structure and the method described in the present description without however departing from the scope of the invention defined by the annexed claims. In particular, it will be noted that those skilled in the art have available a great variety of techniques to assure the deposition and formation of the various layers of the structure according to the present invention and that certain steps may be performed in accordance with a different chronological order.

What is claimed is:

1. A method of manufacturing a structure on a substrate having a first face or front face and a second face or back face, this substrate being formed of a semiconductor base material intended to be etched by the KOH reactive agent, this method including a first step during which at least one zone formed of a material capable of being etched by said KOH reactive agent is formed on said front face, and a second step during which said substrate is etched by said KOH reactive agent, wherein, prior to said second step, a metal film including at least one external gold layer is formed on said front face of the structure so as to cover at least said zone and to protect said at least one zone from etching by said KOH reactive agent during said second step.

2. The manufacturing method according to claim 1, wherein, prior to forming said external gold layer, an intermediate metal layer is formed on said front face, this intermediate metal layer acting as a diffusion barrier and adhesion promoter.

3. The manufacturing method according to claim 2, wherein said intermediate metal layer is formed of TiW, TiN or TiW:N.

4. The manufacturing method according to claim 1, wherein said external gold layer is formed by sputtering.

5. The manufacturing method according to claim 1, wherein, in order to form said external gold layer, a first gold layer is formed by sputtering, and a second gold layer is formed above said first gold layer by electro-deposition.

6. A method of manufacturing an integrated sensor with a membrane, this integrated sensor being made on a substrate having a first face or front face and a second face or back face, this substrate being formed of a semiconductor base material intended to be etched by the KOH reactive agent, this method including at least:

a first step consisting in forming a dielectric layer on said front face of the substrate and at least one connection pad on said dielectric layer, this connection pad being formed of a material capable of being etched by said KOH reactive agent;

a second step consisting in forming at least one electric bump above said connection pad; and a third step consisting in etching the back face of the substrate by means of said reactive agent in order to form a membrane of said integrated sensor, wherein, during said second step, a metal film is formed on said front face so as to cover at least said connection pad, this metal film including at least one external gold layer which is used as a plating base for forming said at least one electric bump during said second step and as protection against etching by said reactive agent during said third step.

7. The manufacturing method according to claim 6, wherein, prior to forming said external gold layer, an intermediate metal layer is formed on said front face, this intermediate metal layer acting as a diffusion barrier and adhesion promoter.

8. The manufacturing method according to claim 7, wherein said intermediate metal layer is formed of TiW, TiN or TiW:N.

9. The manufacturing method according to claim 6, wherein said external gold layer is formed by sputtering.

10. The manufacturing method according to claim 6, wherein, in order to form said external gold layer, a first gold layer is formed by sputtering, and a second gold layer is formed above said first gold layer by electro-deposition.

11. The manufacturing method according to claim 6, further comprising a fourth step consisting in etching said metal film, after formation of said membrane, in order to electrically separate said at least one electric bump.

* * * * *